United States Patent
Grady et al.

(10) Patent No.: US 12,426,159 B2
(45) Date of Patent: Sep. 23, 2025

(54) ELECTRICAL STRUCTURE WITH NON-LINEAR ELECTRICAL INTERCONNECT

(71) Applicant: Georgia Tech Research Corporation, Atlanta, GA (US)

(72) Inventors: Michael D. Grady, Smyrna, GA (US); Mark M. Bolding, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 360 days.

(21) Appl. No.: 18/166,562

(22) Filed: Feb. 9, 2023

(65) Prior Publication Data

US 2023/0254972 A1    Aug. 10, 2023

Related U.S. Application Data

(60) Provisional application No. 63/308,348, filed on Feb. 9, 2022.

(51) Int. Cl.
| | |
|---|---|
| *H05K 1/11* | (2006.01) |
| *H01P 1/20* | (2006.01) |
| *H01P 1/203* | (2006.01) |
| *H05K 1/02* | (2006.01) |

(52) U.S. Cl.
CPC ............... *H05K 1/115* (2013.01); *H01P 1/20* (2013.01); *H01P 1/2005* (2013.01); *H01P 1/203* (2013.01); *H05K 1/0219* (2013.01); *H05K 2201/09854* (2013.01)

(58) Field of Classification Search
CPC ............. H05K 1/115; H05K 1/0219; H05K 2201/09854; H01P 1/20; H01P 1/2005
USPC ........................................................ 333/202
See application file for complete search history.

(56) References Cited

U.S. PATENT DOCUMENTS

| | | | |
|---|---|---|---|
| 6,670,921 B2* | 12/2003 | Sievenpiper | .......... H01P 1/2005 |
| | | | 343/754 |
| 2015/0084208 A1* | 3/2015 | Iida | .................. H01L 23/49827 |
| | | | 257/774 |

OTHER PUBLICATIONS

Wenquan Cao, Bangning Zhang, Tongbin Yu, Daosheng Guo and Aijun Liu, "Helical-viatype mushroom EBG structure for size reduction," 2011 Second International Conference on Mechanic Automation and Control Engineering, Hohhot, 2011, pp. 1347-1349, doi:10.1109/MACE.2011.5987193.

* cited by examiner

*Primary Examiner* — Andrea Lindgren Baltzell
*Assistant Examiner* — Abigail Amir Yaldo
(74) *Attorney, Agent, or Firm* — Meunier Carlin & Curfman LLC

(57) ABSTRACT

In an embodiment, a 3D-printed electrical structure such as an electromagnetic bandgap is provided. The structure includes a dielectric material with an embedded electrical interconnect that functions like a via and electrically connects a first surface of the dielectric material with a second surface of the dielectric material such as a ground plane. Unlike conventional vias, the embedded interconnect is not limited to straight lines and can take a variety of shapes and paths in the dielectric material allowing for the electrical interconnect to have a longer length than the thickness of the dielectric material. Increasing the length of the electrical interconnect increases the inductance of the electrical interconnect which in turn increases the bandwidth and reduces the frequency of the electrical structure without an increase in the height of the dielectric material.

13 Claims, 17 Drawing Sheets

ELECTRICAL STRUCTURE WITH NON-LINEAR ELECTRICAL INTERCONNECT

CROSS-REFERENCE TO RELATED APPLICATIONS

This application claims priority to U.S. Provisional Patent Application No. 63/308,348, filed on Feb. 9, 2022, and entitled "3D-Printed Electromagnetic Bandgap (EBG) Structure." The disclosure of which is hereby incorporated by reference in its entirety.

BACKGROUND

A vertical interconnect access (via) is a type of electrical connection that is used to connect layers of a printed circuit board or other types of dielectric materials. During the manufacturing of the printed circuit board, holes for the vias are typically created in each layer using a drill or a laser. Because of this, vias are currently limited to linear configurations that are typically perpendicular to the surfaces of the circuit board or dielectric material.

In general, it is known that increasing the length of a via or electrical interconnect leads to an increase in the inductance of the electrical interconnect. This increase in inductance results in an increase in bandwidth for an associated electrical structure. However, because of the verticality of vias described above, the length of vias and other electrical interconnects cannot be increased without also increasing the thickness of the associated circuit board or dielectric, which is undesirable.

It is with respect to these and other considerations that the various aspects and embodiments of the present disclosure are presented.

SUMMARY

In an embodiment, a 3D-printed electrical structure such as an electromagnetic bandgap is provided. The structure includes a dielectric material with an embedded electrical interconnect that functions like a via and electrically connects a first surface of the dielectric material with a second surface of the dielectric material such as a ground plane. Unlike conventional vias, the embedded interconnect is not limited to straight lines and can take a variety of shapes and paths in the dielectric material allowing for the electrical interconnect to have a longer length than the thickness of the dielectric material. Increasing the length of the electrical interconnect increases the inductance of the electrical interconnect which in turn increases the bandwidth and reduces the frequency of the electrical structure without an increase in the height of the dielectric material. The electrical interconnect may be either a monoaxial or a coaxial interconnect. The electrical structure may be used in a variety of devices such as an electromagnetic bandgap structure, a balun in a radio frequency system, or a true time delay device in a phased array system.

In an embodiment, an electrical structure is provided. The electrical structure includes: a dielectric material having a first surface and a second surface, wherein the first surface and the second surface are substantially parallel and are separated by a distance; and an electrical interconnect embedded in the dielectric material and connecting the first surface with the second surface of the dielectric material, wherein a length of the electrical interconnect in the dielectric material is greater than the distance.

Embodiments may have some or all of the following features. The electrical structure may include a printed circuit board and the second surface may include a ground plane. The electrical interconnect may be a via. The electrical interconnect may be monoaxial or coaxial. The electrical interconnect may have a helical shape. The electrical interconnect may include: a first vertical portion connected to the first surface; a helical portion connected to the first vertical portion; and a second vertical portion connected to the helical portion and the second surface. The electrical structure may include an electromagnetic bandgap structure. The electrical structure may be a filter.

In an embodiment, an electrical structure is provided. The structure may include: a plurality of cells, wherein each cell of the plurality of cells comprises: a dielectric material having a first surface and a second surface, wherein the first surface and the second surface are substantially parallel and are separated by a distance; and an electrical interconnect embedded in the dielectric material and connecting the first surface with the second surface of the dielectric material, wherein a length of the electrical interconnect in the dielectric material is greater than the distance.

Embodiments may include some or all of the following features. The electrical structure may include a printed circuit board. Each second surface may include a ground plane. Each electrical interconnect may be a via. Each electrical interconnect may be monoaxial or coaxial. Each electrical interconnect may have a helical shape. Each electrical interconnect may include: a first vertical portion connected to the first surface; a helical portion connected to the first vertical portion; and a second vertical portion connected to the helical portion and the second surface. The electrical structure may include an electromagnetic bandgap structure. The electrical structure is a filter.

In an embodiment, an electrical structure is provided. The electrical structure includes: a dielectric material having a first surface and a second surface, wherein the first surface and the second surface are substantially parallel, are substantially a same size, and are separated by a distance between a point of first surface and a point of the second surface; and an electrical interconnect embedded in the dielectric material and connecting the point of the first surface with the point of the second surface of the dielectric material, wherein a length of the electrical interconnect in the dielectric material is greater than the distance. The electrical interconnect may include: a first vertical portion connected to the point of the first surface; a helical portion connected to the first vertical portion; and a second vertical portion connected to the helical portion and the point of the second surface. The electrical interconnect may be monoaxial or coaxial.

This summary is provided to introduce a selection of concepts in a simplified form that are further described below in the detailed description. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of illustrative embodiments, is better understood when read in conjunction with the appended drawings. For the purpose of illustrating the embodiments, there is shown in the drawings example constructions of the embodiments; however, the embodiments are not limited to the specific methods and instrumentalities disclosed. In the drawings.

DETAILED DESCRIPTION

Figure 1A:
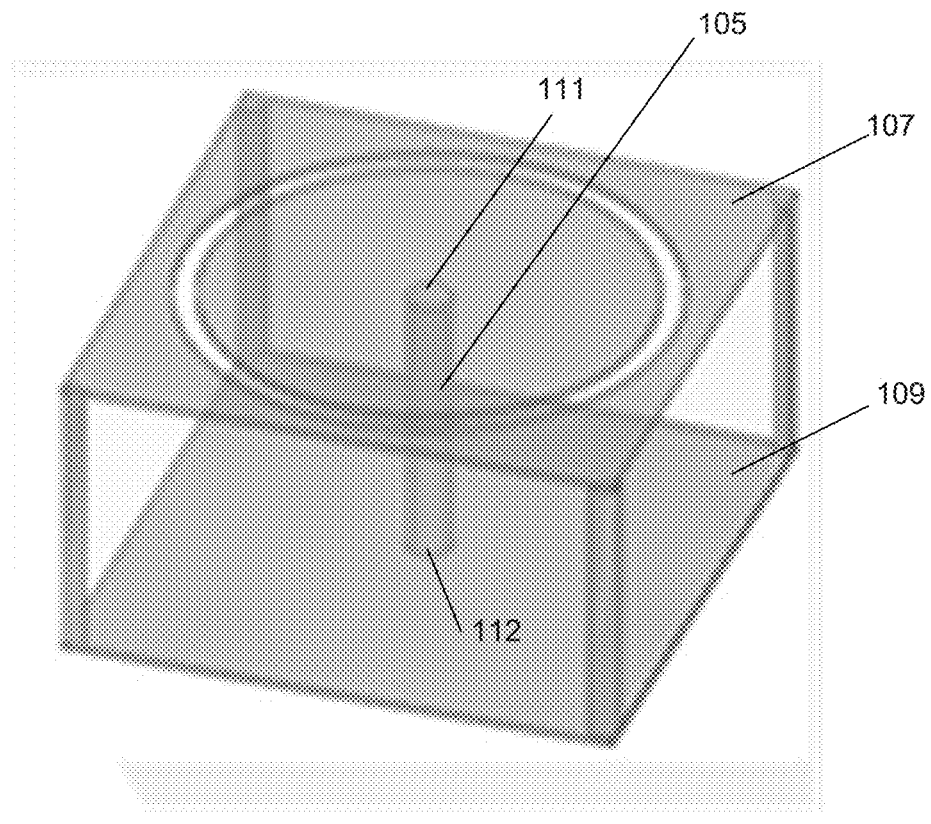
FIG. 1A is an illustration of a perspective view of a prior art electrical structure.
Figure 1B:
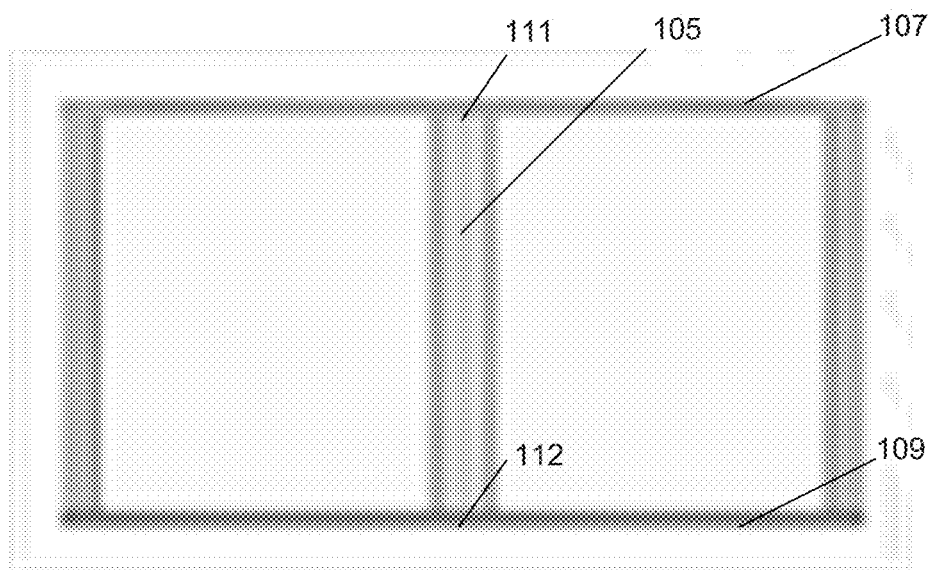
FIG. 1B is an illustration of a front view of a prior art electrical structure.

FIG. 1A and FIG. 1B are illustrations of a prior art electrical structure 100. In the examples shown, each electrical structure 100 may be made up of a dielectric material and may have a first surface 107 and a second surface 109. The first surface 107 and second surface 109 may be substantially parallel and may be approximately the same size or area. In some embodiments, the first surface 107 may be a top surface and the second surface 109 may be a bottom surface, or vice versa. In other embodiments, the first surface 107 may be a left-side surface and the second surface 109 may be a right-side surface, or vice versa. Other special configurations of the first and second surfaces may be supported.

Passing through the electrical structure 100 is an electrical interconnect 105. As shown, the electrical interconnect 105 passes through a point 111 of the first surface 107, goes through the dielectric material, and exits the electrical structure 100 through a point 112 of the second surface 109. The electrical interconnect 105 may be a via that electrically connects a trace, or other conductor, on the first surface 107 to a trace, or other conductor on the second surface 109. In some embodiments, the second surface 109 may connect to a ground plane.

As can be seen in FIGS. 1A and 1B, the electrical interconnect 105 runs vertically through the dielectric material of the electrical structure 100 and is substantially perpendicular to the first surface 107 and the second surface 109. Accordingly, a length of the electrical interconnect 105 is approximately the same as a height of the electric structure 100. As described above, this is due to how vias are created in electrical structures such as printed circuit boards, where laser or drills are used to create vertical holes through the structure for use by the vias.

To allow for vias, and other electrical interconnects 105, to have varying lengths and sizes in printed circuit boards and other dielectric materials, in some embodiments, a 3D printer may be used to print both the dielectric material of the electric structure as well as the conductive material of the electrical interconnect 105 at approximately the same time. A suitable 3D printer includes the DragonFly® printer from Nano Dimension. Other printers may be used.

Because the conductive material is deposited during the printing process at the same time as the dielectric material, the conductive material can be placed at a variety of positions within the conductive material allowing for a variety of different shapes and lengths for the electrical interconnect 105. As will be described further below, these shapes include various curves and designs including helical curves, for example.

Figure 2A:
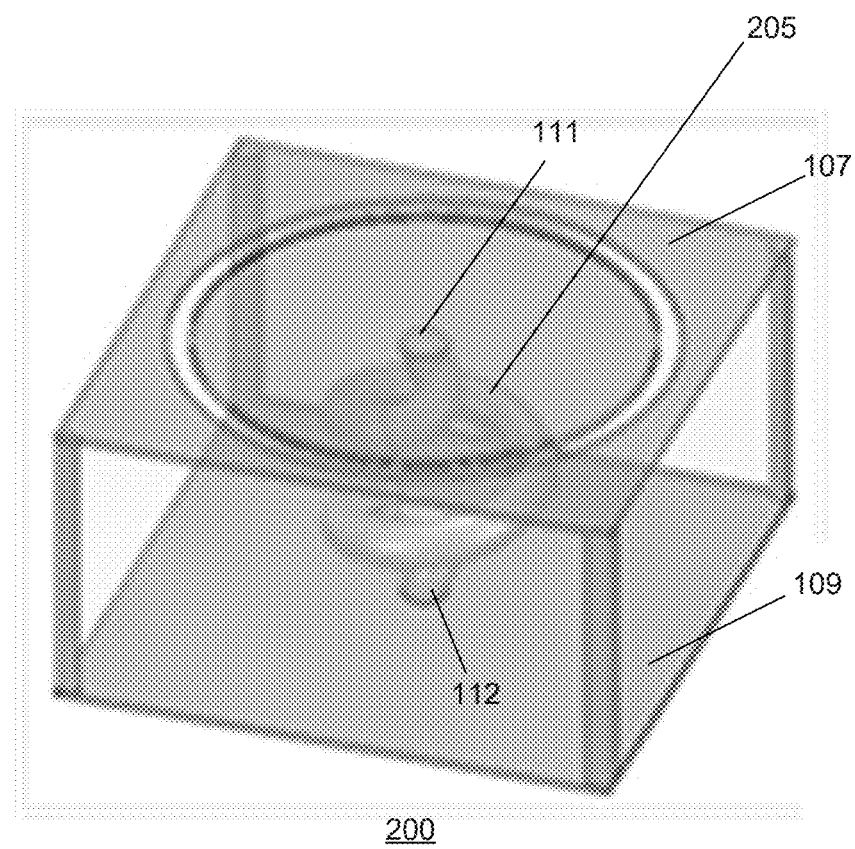
FIG. 2A an illustration of a perspective view of an example electrical structure.
Figure 2B:
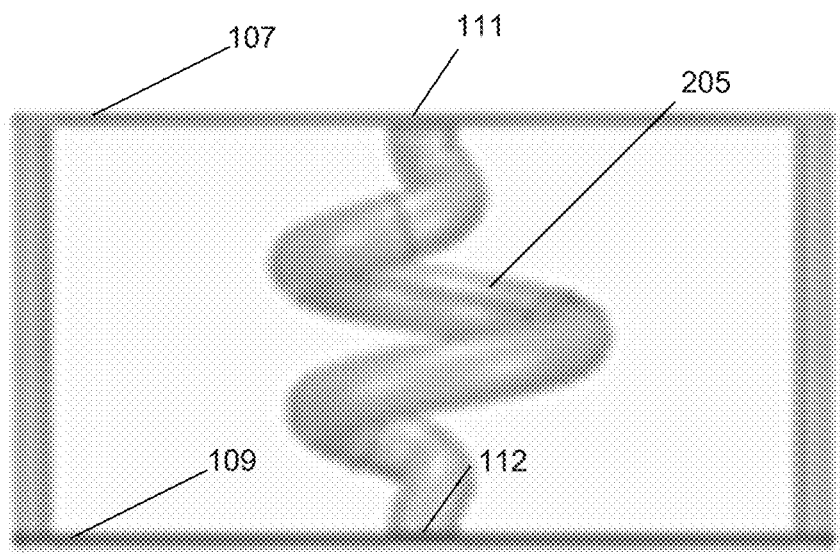
FIG. 2B an illustration of a front view of an example electrical structure.

FIGS. 2A and 2B are illustrations of an example electrical structure 200 printed using such a 3D printer. Like the electrical structure 100, the electrical structure 200 may be made up of a dielectric material and may have a first surface 107 and a second surface 109. The first surface 107 and second surface 109 may be substantially parallel and approximately the same size or area.

Passing through the electrical structure 200 is an electrical interconnect 205. Like the electrical interconnect 105, the electrical interconnect 205 passes through a point 111 of the first surface 107, goes through the dielectric material, and exits the electrical structure 200 through a point 112 of the second surface 109. The points may be center points, but other points may be supported. The electrical interconnect 205 may be a via that electrically connects a trace, or other conductor, on the first surface 107 to a trace, or other conductor on the second surface 109. In some embodiments, the second surface 109 may connect to a ground plane.

However, unlike the electrical interconnect 105, the electrical interconnect 205, as can be seen in the FIGS. 2A and 2B, is not a straight wire. In contrast with the electrical interconnect 105, the electrical interconnect 205 is curved and travels a 3D helical path through the dielectric material. Thus, the length of the electrical interconnect 205 can be greater than the height of the electrical structure 200, unlike the length of the interconnect 105 which is limited to height of the electrical structure 100.

Increasing the length of the electrical interconnect 205, without also increasing the size of the electrical structure 200 provides many advantages one of which is increased inductance of the electrical interconnect 205. An increase in inductance provides for an increase in bandwidth of the electrical structure 200 without a corresponding increase in frequency. In particular, the relationship between bandwidth (BW) of an electromagnetic band gap structure that incorporates the electrical structure 200 and inductance (L) is shown by the following equation 1 where C is the capacitance of the electrical device:

$$BW \propto \sqrt{L/C} \qquad (1)$$

Figure 3:
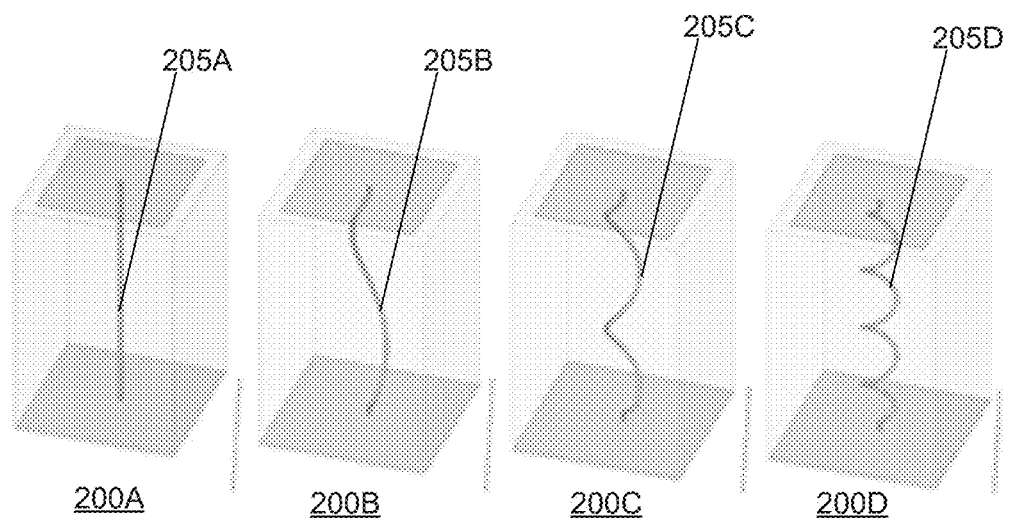
FIG. 3 is an illustration of four example electrical structures.

FIG. 3 is an illustration of example electrical structures 200 (i.e., the structures 200A, 200B, 200C, and 200D) showing how the length of the electrical interconnect 205 (and the number of turns) relates to inductance. As described above, increasing the length of the electrical interconnect 205 also increases the inductance. However, to increase the length of the electrical interconnect 205 in the electrical structure 200, the electrical interconnect 205 must take a non-linear path through the dielectric material of the electrical structure 200. However, as the electrical interconnect 205 approaches the boundaries of the dielectric material, the risk of electrical interference between the electrical interconnect 205 and an electrical interconnect 205 in an adjacent electrical structure 200 increases. As these electrical structures 200 may be used as cells in arrays for RADARs, filters, or other devices, reducing electrical interference is desirable.

Accordingly, in some embodiments, in order to maximize the length of the electrical interconnect 205, while minimizing the risk of electrical interference, the electrical interconnect 205 may be designed to follow a helical curve which is a three dimensional curve about an axis. Each curve in the helical curve is referred to as a turn.

For example, FIG. 3 shows four example electrical structures 200 with differently shaped electrical interconnects 205. The electrical structure 200A has an electrical interconnect 205A with a length of 1.54 mm and a measured inductance of 0.9964 nH. The electrical interconnect 205A is referred to as the reference interconnect 205A because it is a straight vertical line with no curves.

The electrical structures 200B, 200C, and 200D each have an electrical interconnect 205 with a helical shape with a different number of turns. Note that the radius of each helical shape remains constant across all of the interconnects 205. The radius of the helical shapes may be selected to be as large as possible without being so close to the sides of the dielectric material so as to interfere with an adjacent electrical structure 200. Furthermore, the axis of each of the helical shapes is the vertical line corresponding to the reference interconnect 205A.

The electrical structure 200B has an electrical interconnect 205B with a length of 1.7286 mm and a single turn. This results in a measured inductance of 1.0402 nH, which is a 4.4% increase when compared to the 0.9964 nH inductance of the reference interconnect 205A. The electrical structure 200C has an electrical interconnect 205C with a length of 2.0037 mm and two turns. This results in a measured inductance of 1.1619 nH, which is a 16.6% increase when compared to the 0.9964 nH inductance of the reference interconnect 205A. The electrical structure 200D has an electrical interconnect 205D with a length of 1.7286 mm and four turns. This results in a measured inductance of 1.4396 nH, which is a 44.5% increase when compared to the 0.9964 nH inductance of the reference interconnect 205A. As can be observed, increasing the length of the electrical interconnect 205 by increasing the number of turns of the helical curve results in an increase in the inductance.

Figure 4:
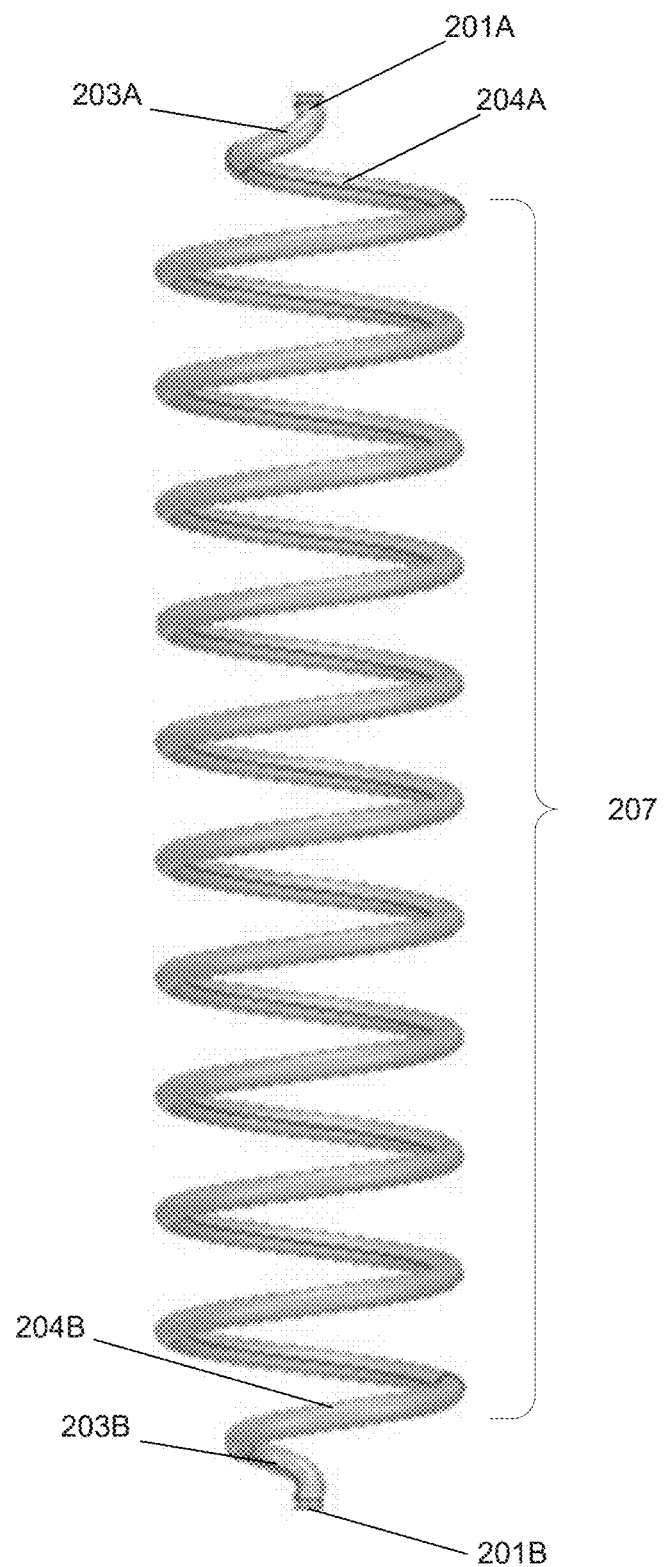
FIG. 4 is an illustration of an example electrical interconnect.

FIG. 4 is an illustration of an example electrical interconnect 205. As shown, the electrical interconnect 205 includes several portions. Starting from the top, the electrical interconnect 205 includes a vertical portion 201A. The vertical portion 201A connects to, or infaces, with the point of the first surface of the electrical structure 200.

The vertical portion 201A connects to a first helical region 203A. The first helical region 203A may have a radius. As shown, the helical region 203A has a single turn. Depending on the embodiment, more turns may be supported.

The first helical region 203A connects to a transition region 204A that in turn connects to a second helical region 207. The second helical region has a larger radius than the first helical region 203A. In the example shown, the second helical region 207 has eleven turns. Depending on the embodiment, more or fewer turns may be supported.

The second helical region 207 connects to a transitional region 204B, that in turn connects to a first helical region 203B. Like the first helical region 203A, the first helical region 203B has a radius that is less than the radius of the second helical region 207.

Finally, the first helical region 203B connects to a vertical portion 201B. The vertical portion 201B connects to, or infaces, with the point of the second surface of the electrical structure 200. The second surface may connect to a ground plane.

Figure 5:
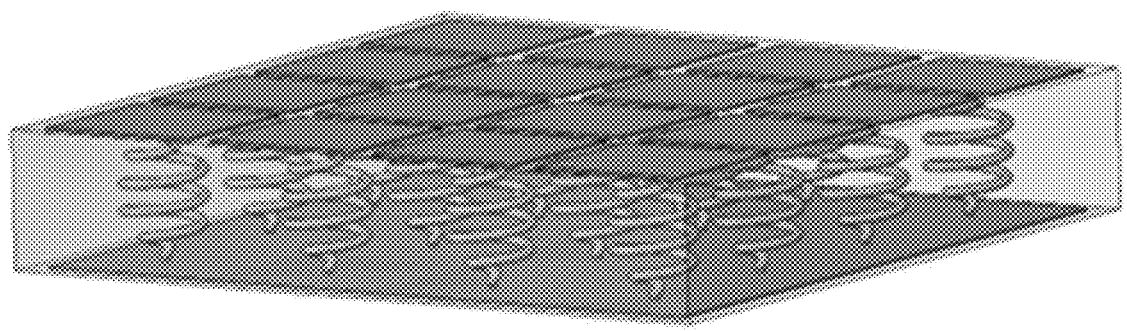
FIG. 5 is an illustration of an example array of electrical structures.

FIG. 5 is an illustration of an example array 500 of electrical structures. As described above, electrical structures 200, such as electromagnetic bandgaps, may be arranged into an array with each electrical structure 200 corresponding to a cell in the array. In the example shown, the array 500 includes 16 cells. More or fewer cells may be supported. Example uses for the array 500 includes spatial filters and RADAR absorbing devices.

FIG. 6 are illustrations of example electrical structures that can be generated using the 3D printing method described herein. As may be appreciated, the 3D printing techniques allow for a variety of electrical interconnect 205 shapes printed into a rigid dielectric material. These electrical interconnects 205 can be used to create rigid cables that cannot bend, with constant impedance, and in a variety of shapes.

Figure 6A:
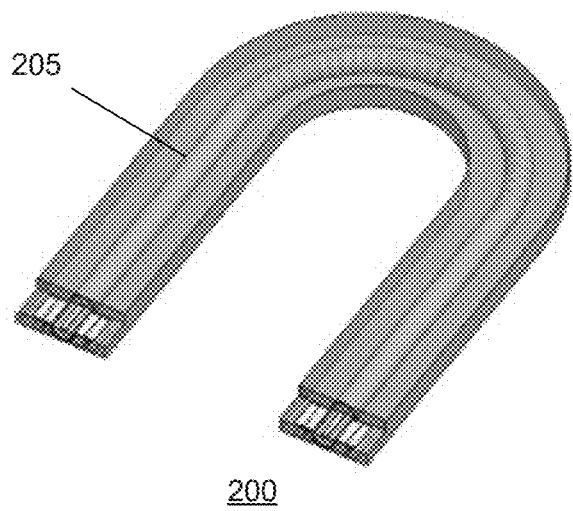
FIG. 6A is an illustration of an example electrical structure.
Figure 6B:
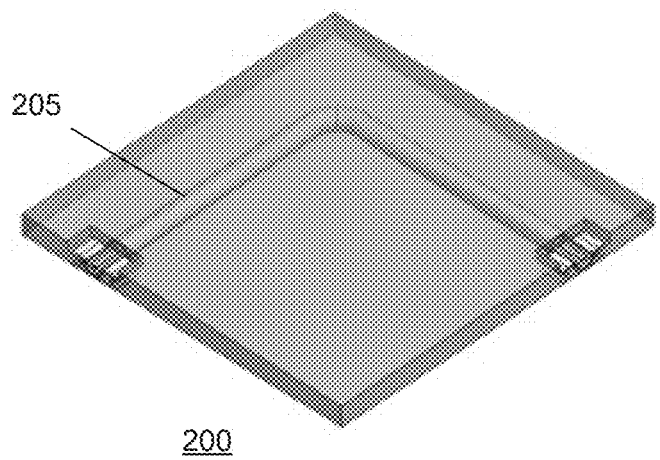
FIG. 6B is an illustration of an example electrical structure.

For example, FIG. 6A shows the electrical structure 200 formed into a rigid "U" shaped monoaxial or coaxial cable. FIG. 6B shows the electrical structure 200 formed into a rigid cable with a 90 degree bend. Other types of cables and shapes may be supported.

Figure 7:
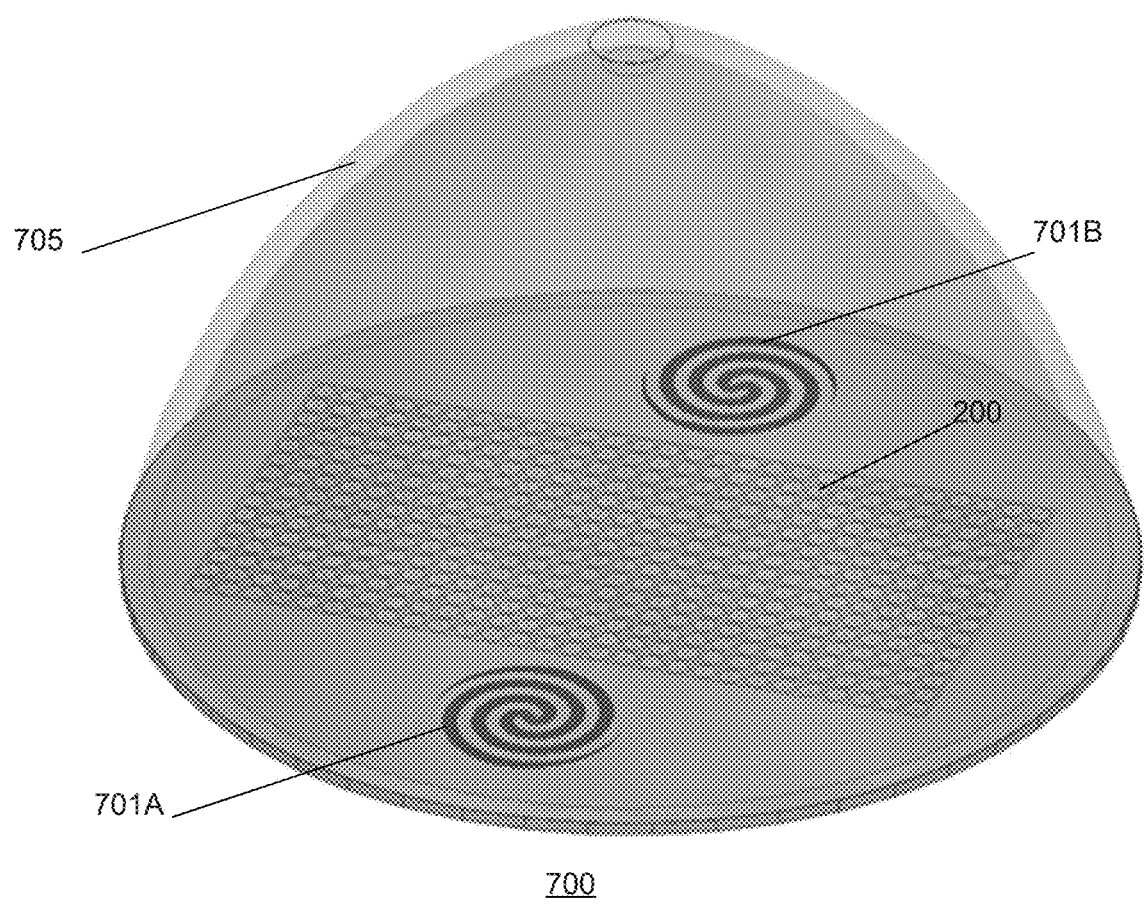
FIG. 7 is an illustration of an example electrical structure used in a transmit and receive antenna embodiment.

FIG. 7 is an illustration of the electrical structure 200 used in a transmit and receive antenna scenario. In the example shown, an aircraft nosecone 700 includes an array of electrical structures 200 and two antennas 701. The antenna 701A may be a receive antenna, and the antenna 701B may be a transmit antenna. The antenna 701 may be in a radome cover 705 and may be separated by the array electrical structures 200. The electrical structures 200 in the array may reduce interference between the antennas 701.

Figure 8:
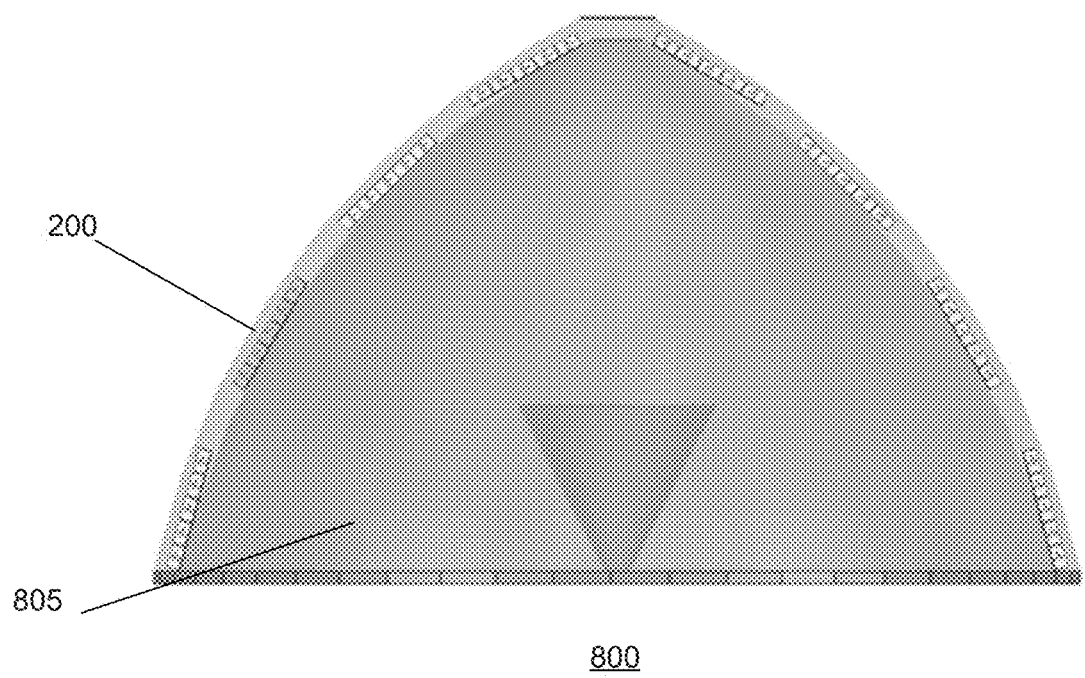
FIG. 8 is an illustration of an example electrical structure used to filter unwanted signals.

FIG. 8 is an illustration of the electrical structure 200 used to filter unwanted signals. In the example shown, a nosecone 800 includes a radome cover 805 with multiple electrical structures 200 embedded into its walls. Each electrical structure 200 may be an electromagnetic bandgap structure and may filter unwanted signals.

Figure 9:
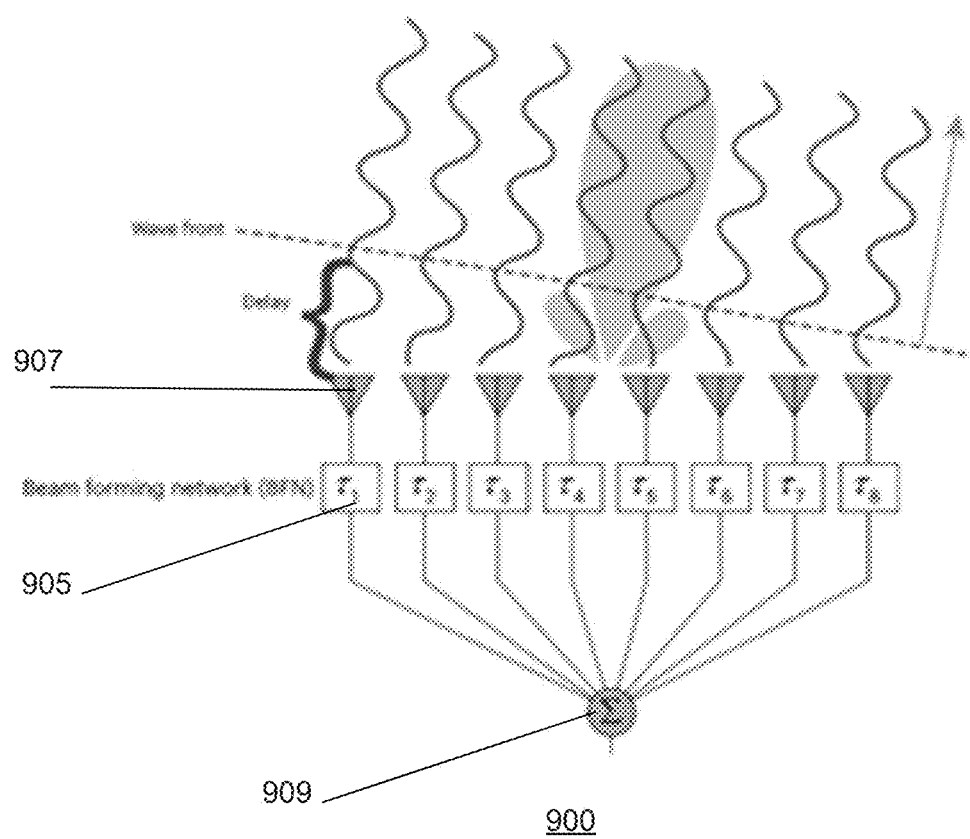
FIG. 9 is an illustration of an example phased array antenna beamformer.
Figure 10:
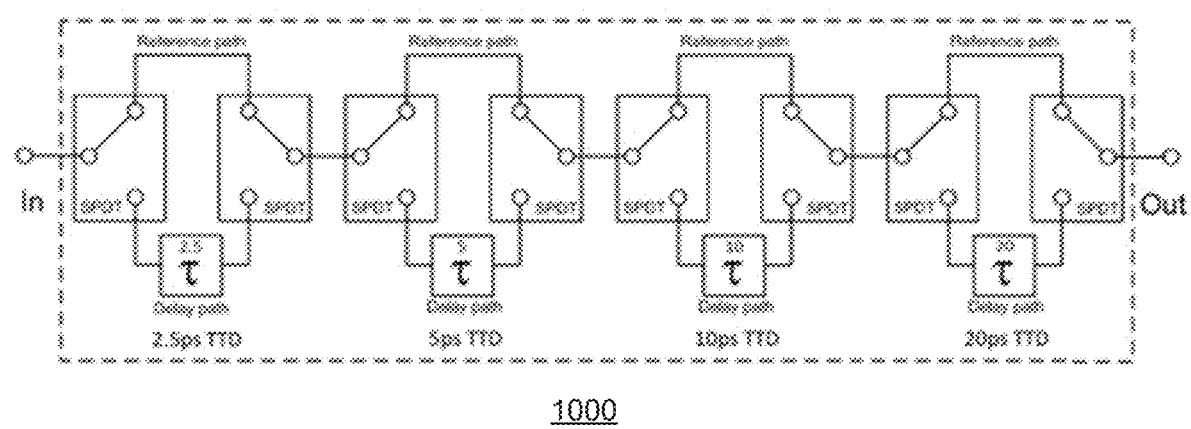
FIG. 10 is an illustration of an example 5-bit true time delay unit used in a phased array antenna system.

FIG. 9 is an illustration of an example phased array antenna beamformer 900. As shown, the beamformer 900 includes a plurality of antenna 907 each connected to a different time delay unit 905 and a power divider 909. FIG. 10 is an illustration of an example 5-bit true time delay unit 1000 used in a phased array antenna system. The delay unit 1000 includes a plurality of single pole double-throw switches each with a different associated time delay.

Figure 11A:
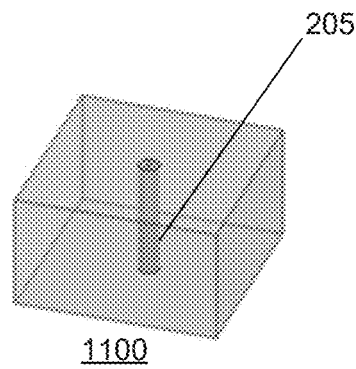
FIG. 11A is an illustration of a perspective view of an example electrical structure.
Figure 11B:
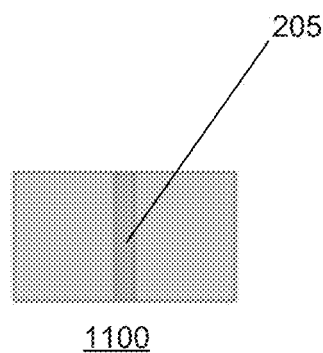
FIG. 11B is an illustration of a front view of an example electrical structure.
Figure 11C:
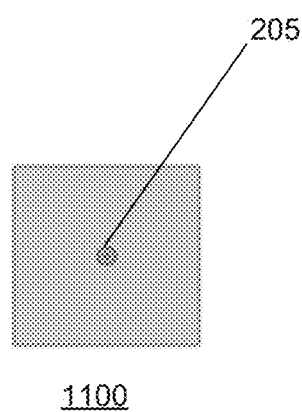
FIG. 11C is an illustration of a top view of an example electrical structure.
Figure 12A:
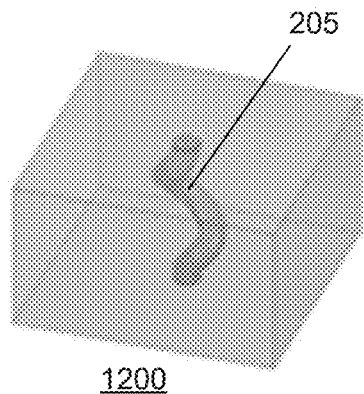
FIG. 12A is an illustration of a perspective view of an example electrical structure.
Figure 12B:
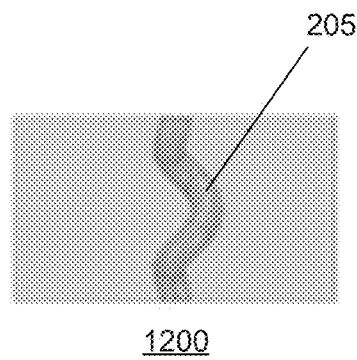
FIG. 12B is an illustration of a front view of an example electrical structure.
Figure 12C:
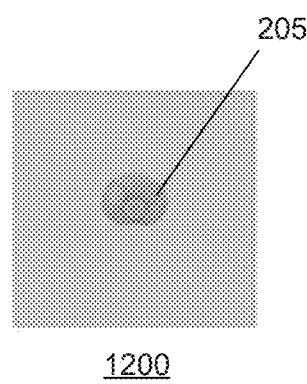
FIG. 12C is an illustration of a top view of an example electrical structure.
Figure 13A:
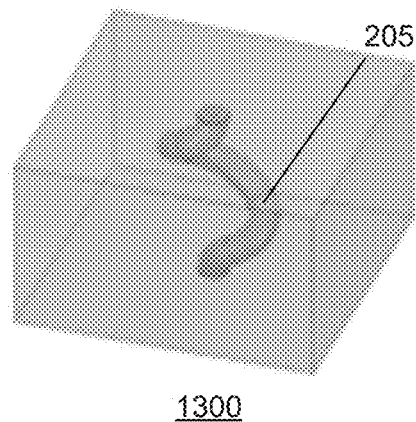
FIG. 13A is an illustration of a perspective view of an example electrical structure.
Figure 13B:
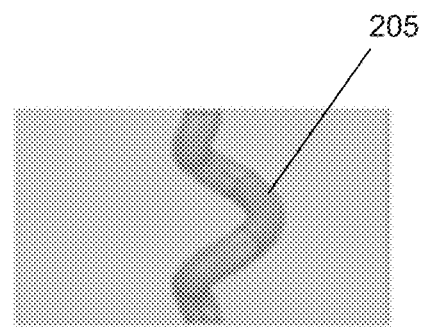
FIG. 13B is an illustration of a front view of an example electrical structure.
Figure 13C:
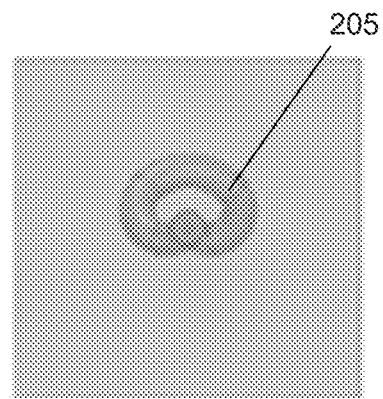
FIG. 13C is an illustration of a top view of an example electrical structure.
Figure 14A:
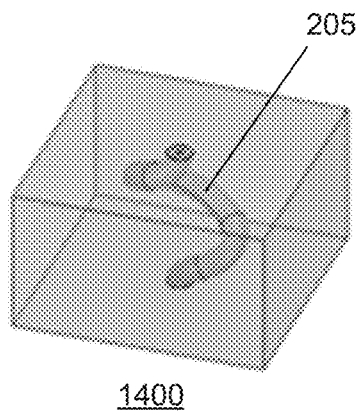
FIG. 14A is an illustration of a perspective view of an example electrical structure.
Figure 14B:
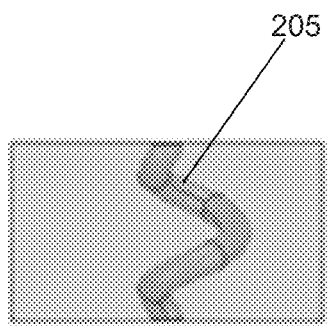
FIG. 14B is an illustration of a front view of an example electrical structure.
Figure 14C:
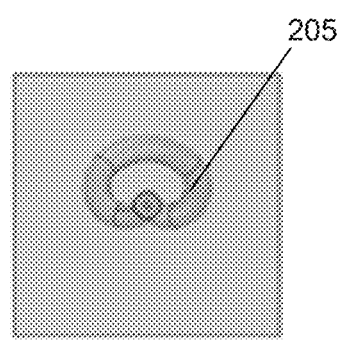
FIG. 14C is an illustration of a top view of an example electrical structure.
Figure 15A:
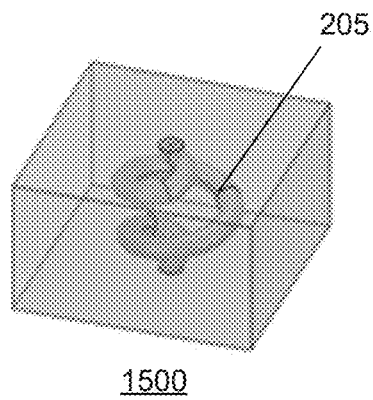
FIG. 15A is an illustration of a perspective view of an example electrical structure.
Figure 15B:
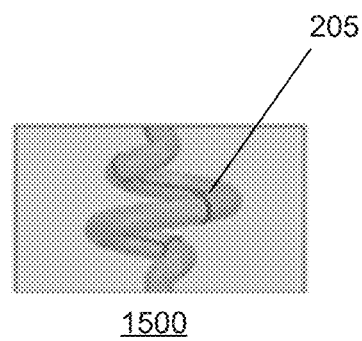
FIG. 15B is an illustration of a front view of an example electrical structure.
Figure 15C:
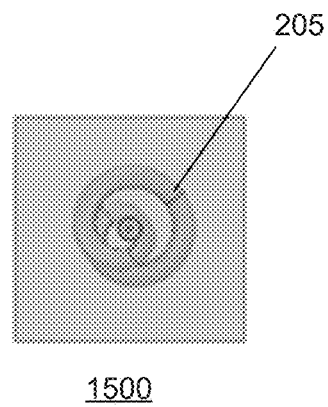
FIG. 15C is an illustration of a top view of an example electrical structure.

In some embodiments, in order to provide the time delays shown in the delay unit 1000, different electrical structures 200, each with a different length electrical interconnect 205 (e.g., coaxial transmission line) may be used. As an example, the FIGS. 11A-11C show different views of an example 3D printed electrical connector 1100 with an electrical interconnect 205 having a length of 59.2 mil, in a substrate with a height of 59.2 mil. As another example, the FIGS. 12A-12C show different views of an example 3D printed electrical connector 1200 with an electrical interconnect 205 having a length of 77.05 mil, in a substrate with a height of 59.2 mil. As another example, the FIGS. 13A-13C show different views of an example 3D printed electrical connector 1300 with an electrical interconnect 205 having a length of 94.9 mil, in a substrate with a height of 59.2 mil. As another example, the FIGS. 14A-14C show different views of an example 3D printed electrical connector 1400 with an electrical interconnect 205 having a length of 130.5 mil, in a substrate with a height of 59.2 mil. As another example, the FIGS. 15A-15C show different views of an example 3D printed electrical connector 1500 with an electrical interconnect 205 having a length of 201.9 mil, in a substrate with a height of 59.2 mil.

Figure 16A:
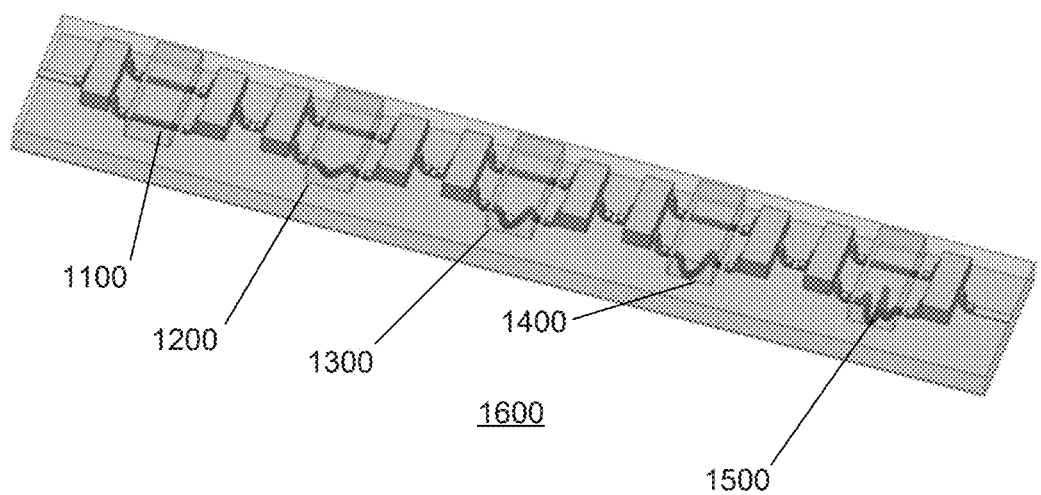
FIG. 16A is an illustration of a perspective view of an example 5-bit time day unit.
Figure 16B:
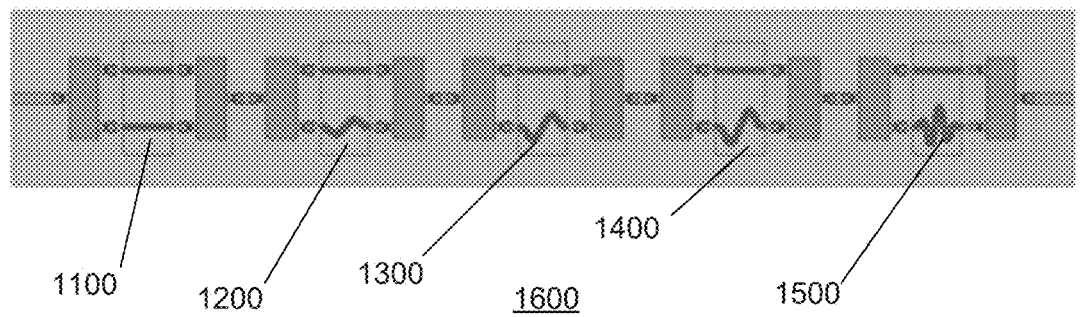
FIG. 16B is an illustration of a top view of an example 5-bit time day unit.
Figure 16C:
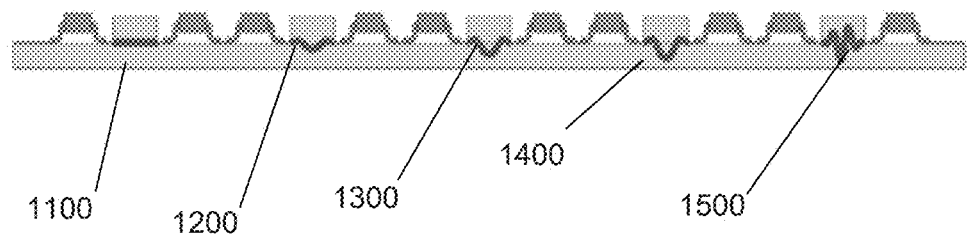
FIG. 16C is an illustration of a front view of an example 5-bit time day unit.

A summary of the time delay characteristics of the electrical structures 1100-1500 shown in the FIGS. 11-15 is described in the table below. FIGS. 16A-C are illustrations of various views of a 5-bit time delay unit 1600 incorporating the electrical structures 1100, 1200, 1300, 1400, and 1500.

length of ¼ of the desired wavelength and the second arm 260B has a length of ¾ of the desired wavelength.

Some references, which may include various patents, patent applications, and publications, are cited in a reference list and discussed in the disclosure provided herein. The citation and/or discussion of such references is provided merely to clarify the description of the present disclosure and is not an admission that any such reference is "prior art" to any aspects of the present disclosure described herein. In terms of notation, "[n]" corresponds to the nth reference in the list. All references cited and discussed in this specification are incorporated herein by reference in their entireties and to the same extent as if each reference was individually incorporated by reference.

Although example embodiments of the present disclosure are explained in some instances in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an," and "the" include plural referents unless the context clearly dictates otherwise. Ranges may be expressed herein as from "about" or "5 approximately" one particular value and/or to "about" or "approximately" another particular value. When such a range is expressed, other exemplary embodiments include from the one particular value and/or to the other particular value.

By "comprising" or "containing" or "including" is meant that at least the name compound, element, particle, or method step is present in the composition or article or method but does not exclude the presence of other compounds, materials, particles, method steps, even if the other such compounds, material, particles, method steps have the same function as what is named. In describing example embodiments, terminology will be resorted to for the sake of clarity. It is intended that each term contemplates its broad-

|  | Bit # | | | | |
|---|---|---|---|---|---|
|  | 1 | 2 | 3 | 4 | 5 |
| Structure | 1100 | 1200 | 1300 | 1400 | 1500 |
| Type of coax line | straight | | helical | | |
| Substrate height | | | 59.2 mil | | |
| Coax Length | 59.2 mil | 77.05 mil | 94.9 mil | 130.5 mil | 201.9 mil |
| Time delay at 10 GHz | 8.2965 ps | 10.7984 ps | 13.3001 ps | 18.2893 ps | 28.2959 ps |
| Relative delay | 0 ps (Reference) | +2.5 ps | +5 ps | +10 ps | +20 ps |

Figure 17:
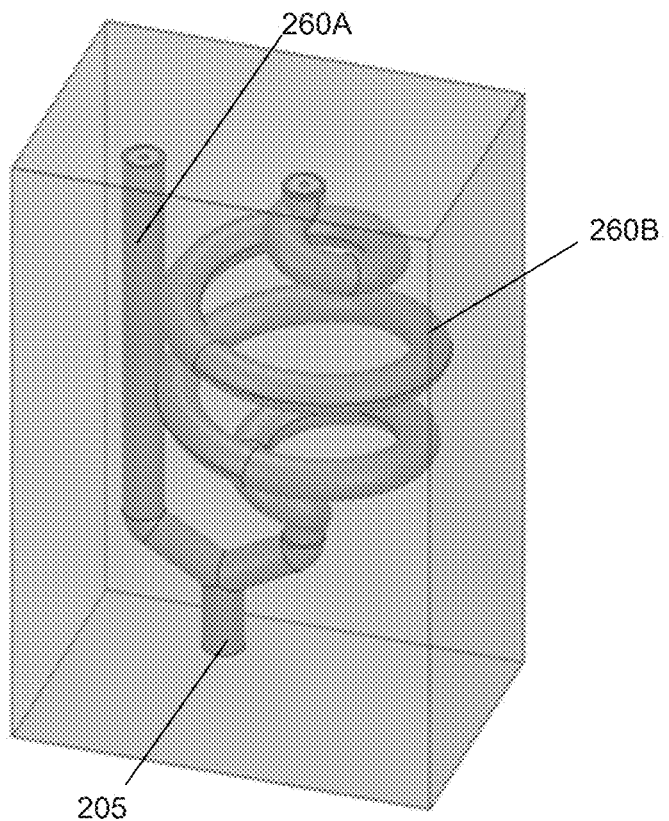
FIG. 17 is an illustration of an example structure 1700 implementing a balun.

FIG. 17 is an illustration of an example structure 1700 implementing a balun. A balun is an electrical device that converts between a balanced signal and an unbalanced signal for a feed line. Generally, a balun includes one arm that is a length of ¼ a desired wavelength and another arm that is a length of ¾ the desired wavelength. Accordingly, the 3D printed electrical structure 1700 may be used to impellent a balun by constructing an electrical interconnect 205 that includes two arms 260. The first arm 260A has a est meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure.

Similarly, it is also to be understood that the mention of one or more components in a device or system does not preclude the presence of additional components or intervening components between those components expressly identified. The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g., 1 to 5 includes 1, 1.5, 2, 2.75, 3, 3.90, 4, 4.24, and 5).

Similarly, numerical ranges recited herein by endpoints include subranges subsumed within that range (e.g., 1 to 5 includes 1-1.5, 1.5-2, 2-2.75, 2.75-3, 3-3.90, 3.90-4, 4-4.24, 4.24-5, 2-5, 3-5, 1-4, and 2-4). It is also to be understood that all numbers and fractions thereof are presumed to be modified by the term "about."

What is claimed:

1. An electrical structure comprising:
    a dielectric material having a first surface and a second surface, wherein the first surface and the second surface are substantially parallel and are separated by a distance; and
    an electrical interconnect embedded in the dielectric material and connecting the first surface with the second surface of the dielectric material, wherein a length of the electrical interconnect in the dielectric material is greater than the distance, wherein the electrical interconnect is a via, and further wherein the first surface is a top surface of the dielectric material and the second surface is a bottom surface of the dielectric material, wherein the electrical interconnect is monoaxial or coaxial.

2. The electrical structure of claim 1, wherein the electrical structure comprises a printed circuit board and the second surface comprises a ground plane.

3. The electrical structure of claim 1, wherein the electrical structure comprises an electromagnetic bandgap structure.

4. The electrical structure of claim 1, wherein the electrical structure is a filter.

5. The electrical structure of claim 1, wherein the electrical interconnect has a helical shape.

6. The electrical structure of claim 1, wherein the electrical interconnect comprises:
    a first vertical portion connected to the first surface;
    a helical portion connected to the first vertical portion; and
    a second vertical portion connected to the helical portion and the second surface.

7. An electrical structure comprising:
    a dielectric material having a first surface and a second surface, wherein the first surface and the second surface are substantially parallel, are substantially a same size, and are separated by a distance between a point of first surface and a point of the second surface; and
    an electrical interconnect embedded in the dielectric material and connecting the point of the first surface with the point of the second surface of the dielectric material, wherein a length of the electrical interconnect in the dielectric material is greater than the distance, wherein the electrical interconnect is a via, and further wherein the first surface is a top surface of the dielectric material and the second surface is a bottom surface of the dielectric material, wherein the electrical interconnect is monoaxial or coaxial.

8. The electrical structure of claim 7, wherein the electrical interconnect comprises:
    a first vertical portion connected to the point of the first surface;
    a helical portion connected to the first vertical portion; and
    a second vertical portion connected to the helical portion and the point of the second surface.

9. An electrical structure comprising:
    a plurality of cells, wherein each cell of the plurality of cells comprises:
    a dielectric material having a first surface and a second surface, wherein the first surface and the second surface are substantially parallel and are separated by a distance; and
    an electrical interconnect embedded in the dielectric material and connecting the first surface with the second surface of the dielectric material, wherein a length of the electrical interconnect in the dielectric material is greater than the distance, wherein the electrical interconnect is a via, and further wherein the first surface is a top surface of the dielectric material and the second surface is a bottom surface of the dielectric material, wherein the electrical structure is one of a filter, an electromagnetic bandgap structure, or a printed circuit board.

10. The electrical structure of claim 9, wherein each second surface comprises a ground plane.

11. The electrical structure of claim 9, wherein each electrical interconnect is monoaxial or coaxial.

12. The electrical structure of claim 9, wherein each electrical interconnect has a helical shape.

13. The electrical structure of claim 9, wherein each electrical interconnect comprises:
    a first vertical portion connected to the first surface;
    a helical portion connected to the first vertical portion; and
    a second vertical portion connected to the helical portion and the second surface.

* * * * *